(12) United States Patent
Lin et al.

(10) Patent No.: US 7,268,440 B2
(45) Date of Patent: Sep. 11, 2007

(54) FABRICATION OF SEMICONDUCTOR INTEGRATED CIRCUIT CHIPS

(75) Inventors: Zong-Huei Lin, Tai-Chung (TW); Hung-Min Liu, Hsin-Chu (TW); Jui-Meng Jao, Miao-Li Hsien (TW); Wen-Tung Chang, Hsin-Chu (TW); Kuo-Ming Chen, Hsin-Chu Hsien (TW); Kai-Kuang Ho, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 295 days.

(21) Appl. No.: 10/905,534

(22) Filed: Jan. 9, 2005

(65) Prior Publication Data

US 2006/0151875 A1    Jul. 13, 2006

(51) Int. Cl.
*H01L 23/544*   (2006.01)
(52) U.S. Cl. .................. 257/797; 257/238; 438/401
(58) Field of Classification Search .............. 257/48, 257/238, 797; 438/401, 462
See application file for complete search history.

(56) References Cited

U.S. PATENT DOCUMENTS

| | | | |
|---|---|---|---|
| 4,610,079 A | 9/1986 | Abe et al. | |
| 5,024,970 A | 6/1991 | Mori | |
| 5,530,280 A | 6/1996 | White | |
| 5,789,302 A | 8/1998 | Mitwalsky et al. | |
| 6,214,703 B1* | 4/2001 | Chen et al. | 438/462 |
| 6,365,958 B1 | 4/2002 | Ibnabdeljalil et al. | |
| 6,383,893 B1 | 5/2002 | Begle et al. | |
| 6,521,975 B1 | 2/2003 | West et al. | |
| 2005/0208684 A1* | 9/2005 | Yamada et al. | 438/14 |
| 2005/0230005 A1* | 10/2005 | Liang et al. | 148/33.3 |
| 2006/0022195 A1* | 2/2006 | Wang | 257/48 |

* cited by examiner

*Primary Examiner*—Fernando L. Toledo
(74) *Attorney, Agent, or Firm*—Winston Hsu

(57) ABSTRACT

A semiconductor wafer includes a plurality of active circuit die areas, each of which being bordered by a dicing line region through which the plurality of active circuit die areas are separated from each other by mechanical wafer dicing. Each of the plurality of active circuit die areas has four sides. An overcoat covers both the active circuit die areas and the dicing line region. An inter-layer dielectric layer is disposed underneath the overcoat. A reinforcement structure includes a plurality of holes formed within the dicing line region. The plurality of holes are formed by etching through the overcoat into the inter-layer dielectric layer and are disposed along the four sides of each active circuit die area. A die seal ring is disposed in between the active circuit chip area and the reinforcement structure.

4 Claims, 3 Drawing Sheets

FABRICATION OF SEMICONDUCTOR INTEGRATED CIRCUIT CHIPS

BACKGROUND OF INVENTION

1. Field of the Invention

The present invention relates generally to semiconductor integrated circuit devices and, more particularly, to the fabrication of semiconductor integrated circuit chips provided with a means of stopping propagation of interface de-lamination between dielectric layers originated from the wafer dicing process.

2. Description of the Prior Art

Semiconductor manufacturers have been shrinking transistor size in integrated circuits (IC) to improve chip performance. This has resulted in increased speed and device density. For sub-micron technology, the RC delay becomes the dominant factor. To facilitate further improvements, semiconductor IC manufacturers have been forced to resort to new materials utilized to reduce the RC delay by either lowering the interconnect wire resistance, or by reducing the capacitance of the inter-layer dielectric (ILD). A significant improvement was achieved by replacing the aluminum (Al) interconnects with copper, which has ~30% lower resistivity than that of Al. Further advances are facilitated by the change of the low-k dielectric materials.

However, one shortcoming associated with the use of low-k dielectrics is that almost all low-k dielectric materials possess relatively lower mechanical strength than that of conventional silicon oxide dielectrics such as FSG or USG. The use of low-k dielectrics poses this industry another problem that the adhesion ability, either at the interface between two adjacent low-k dielectric layers or at the interface between a low-k dielectric layer and a dissimilar dielectric layer, is inadequate to meet the requirements in the subsequent wafer treatment processes such as wafer dicing, which is typically performed to mechanically cut a semiconductor wafer into a number of individual IC chips.

It has been found that the so-called "interface de-lamination" phenomenon occurs between low-k dielectric layers during or after the wafer dicing process is performed, causing performance degradation of the IC chips. In light of the above, a need exists in this industry to provide a solution to the undesired propagation of the interface de-lamination between low-k dielectric layers originated from the wafer dicing process.

SUMMARY OF INVENTION

It is therefore the primary object of the present invention to provide an effective reinforcing structure, which is disposed deliberately along four sides of each die or chip on a wafer in order to stop the propagation of interface de-lamination between low-k dielectric layers originated from the wafer dicing process.

According to the claimed invention, a semiconductor wafer is provided. The semiconductor wafer comprises a plurality of active circuit die areas, each of which being bordered by a dicing line region through which the plurality of active circuit die areas are separated from each other by mechanical wafer dicing. Each of the plurality of active circuit die areas has four sides. An overcoat covers both the active circuit die areas and the dicing line region. An inter-layer dielectric layer is disposed underneath the overcoat. A reinforcement structure comprises a plurality of holes formed within the dicing line region. The plurality of holes are formed by etching through the overcoat into the inter-layer dielectric layer and are disposed along the four sides of each active circuit die area. A die seal ring is disposed in between the active circuit chip area and the reinforcement structure.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to the fabrication of semiconductor chips with a means of stopping propagation of interface de-lamination between low-k dielectric layers originated from the wafer dicing process. As stated supra, interface de-lamination occurs between low-k dielectric layers during the wafer dicing. It has been observed that the interface de-lamination penetrates into the active circuit die area protected by a die seal ring or metallic arrester wall.

Figure 1:
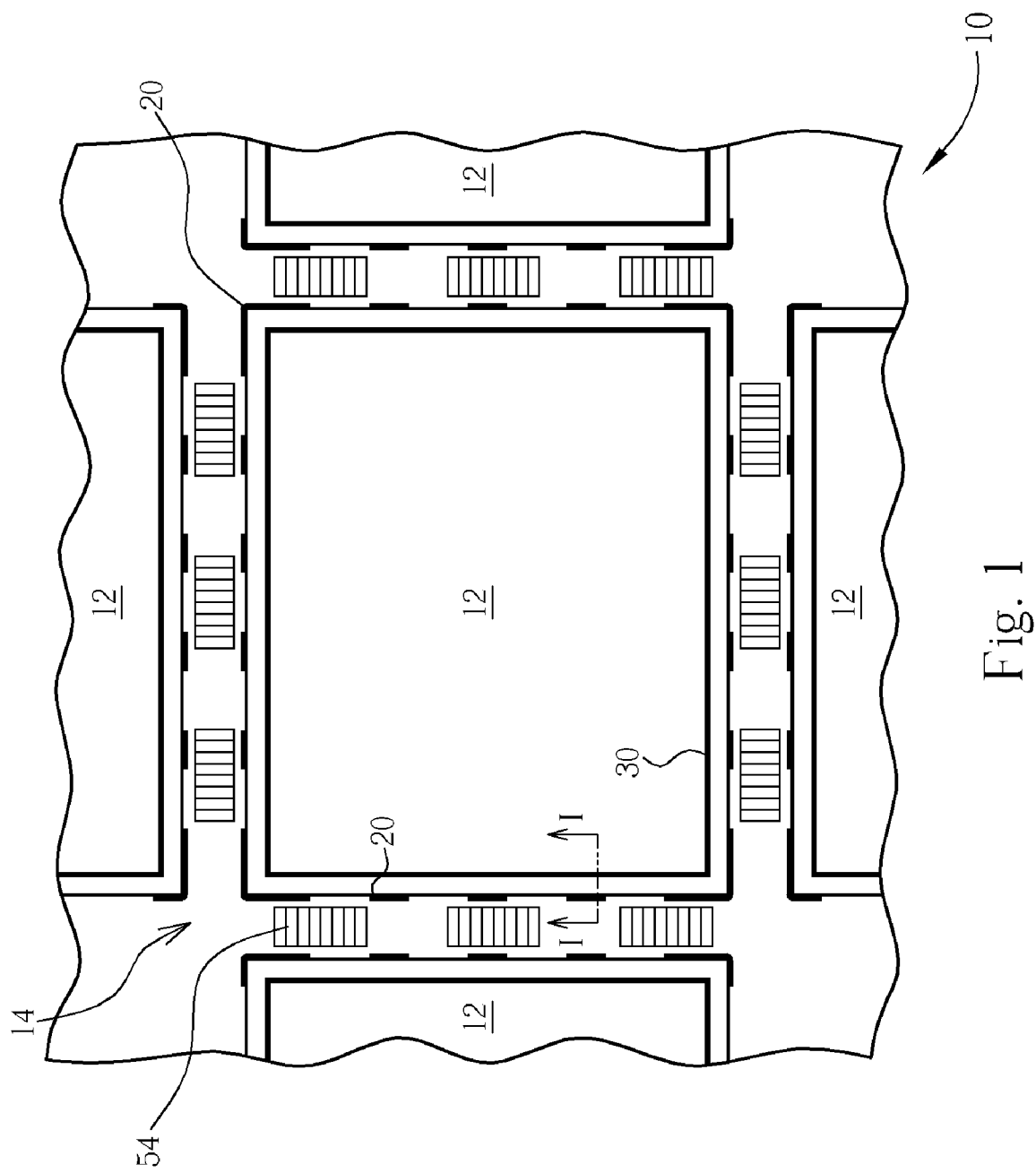
FIG. 1 is an enlarged, schematic plan view of the dicing lines between circuit chips of a semiconductor wafer in accordance with one preferred embodiment of this invention.
Figure 2:
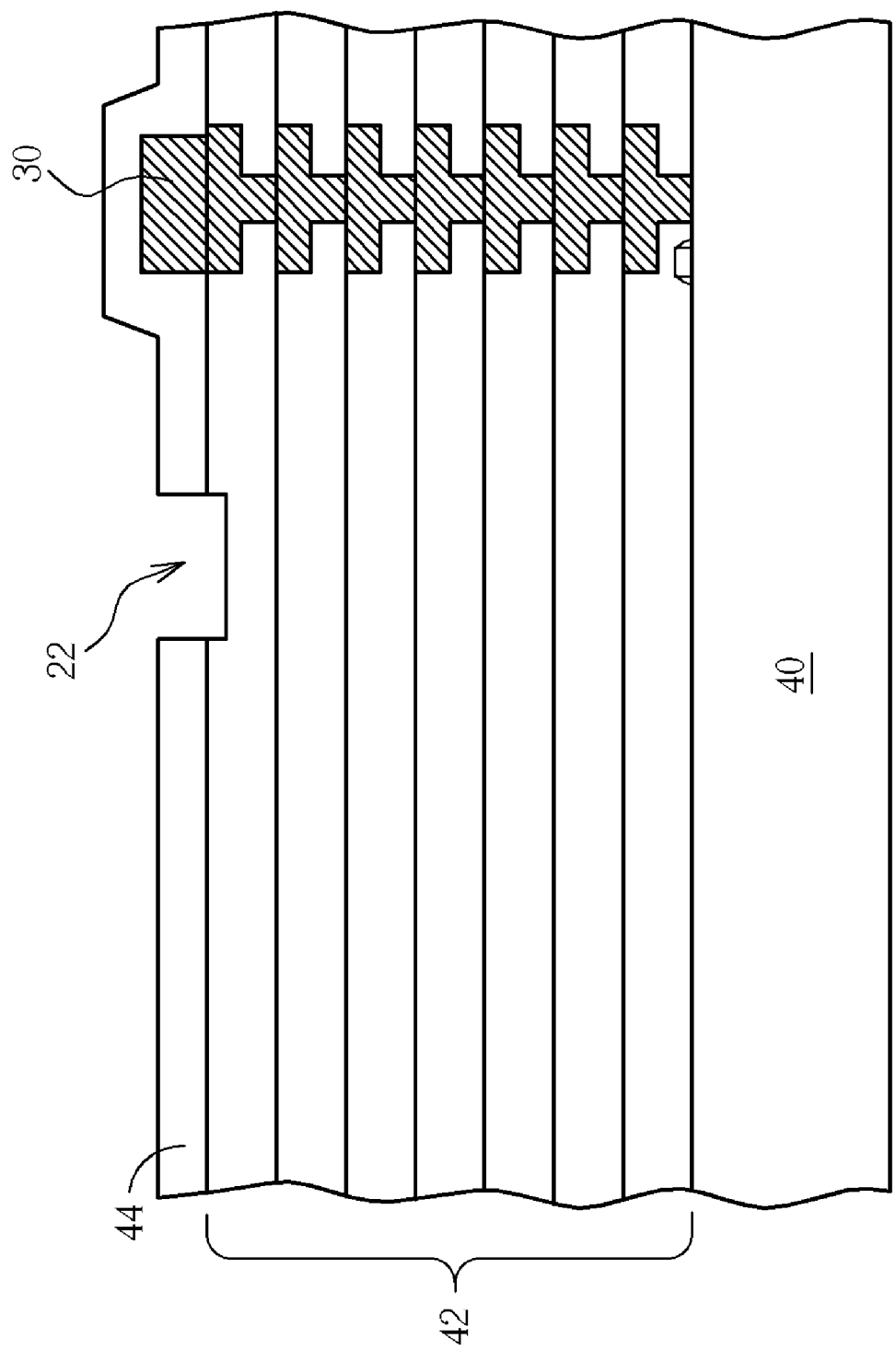
FIG. 2 is a schematic cross section taken along line I-I of FIG. 1 showing portions of a dicing line and an adjacent circuit chip.

Please refer to FIG. 1 and FIG. 2. FIG. 1 is an enlarged, schematic plan view of the dicing lines between circuit chips of a semiconductor wafer 10 in accordance with one preferred embodiment of this invention. FIG. 2 is a schematic cross section through the wafer (taken along line I-I of FIG. 1) showing portions of a dicing line and an adjacent circuit chip. As shown in FIG. 1, the semiconductor wafer 10 comprises a number of circuit chips 12, and for simplicity, only several of them are shown in FIG. 1. Each of the circuit chips 12 has substantially four sides. The illustrated four circuit chips 12 are separated by the intersecting dicing lines 14, which intersect at substantially right angles. Within each circuit chip 12, an active integrated circuit is fabricated. The active integrated circuit may comprise components such as, for example, transistors, diffusions, memory arrays and interconnections. Test key circuits 54 are fabricated within the dicing lines 14.

The active integrated circuit is surrounded by a seal ring structure 30, which is also known as a die seal ring. Such seal ring structure consists of a plurality of patterned metal layers, positioned on top of each other and mutually connected by via or contact plugs. The seal ring structure 30 is common in the art and is utilized to protect the active integrated circuit from being damaged by cracks originating from the wafer dicing process. The seal ring structure 30 may be single seal barrier wall or dual-wall barriers formed in layers of similar or dissimilar dielectric materials.

As shown in FIG. 2, the seal ring structures are manufactured step by step as sequential depositions of insulators and metals in conjunction together with the fabrication of the integrated circuit elements. First, a heavily doped region (not shown) is diffused into the semiconductor material 40 such as a silicon substrate in a process needed otherwise for fabricating strongly doped surface regions in some circuit elements. This heavily doped region serves as an anchor for the seal ring structure to be built, and permits the application of specific electrical potentials to the seal ring structure, such as ground potential or Vss. Finally, a protective overcoat 44 such as silicon nitride covering both the circuit chips and the dicing streets is deposited over the whole wafer.

To stop the interface de-lamination produced during wafer dicing, in accordance with the preferred embodiment of this invention, a reinforcing structure 20 is provided, which is disposed along four sides of each circuit chip 12. As shown in FIG. 2, the reinforcing structure 20 comprises a plurality of holes 22 formed by etching through the overcoat 44 into the inter-layer dielectric 42 with a suitable mask.

Figure 3:
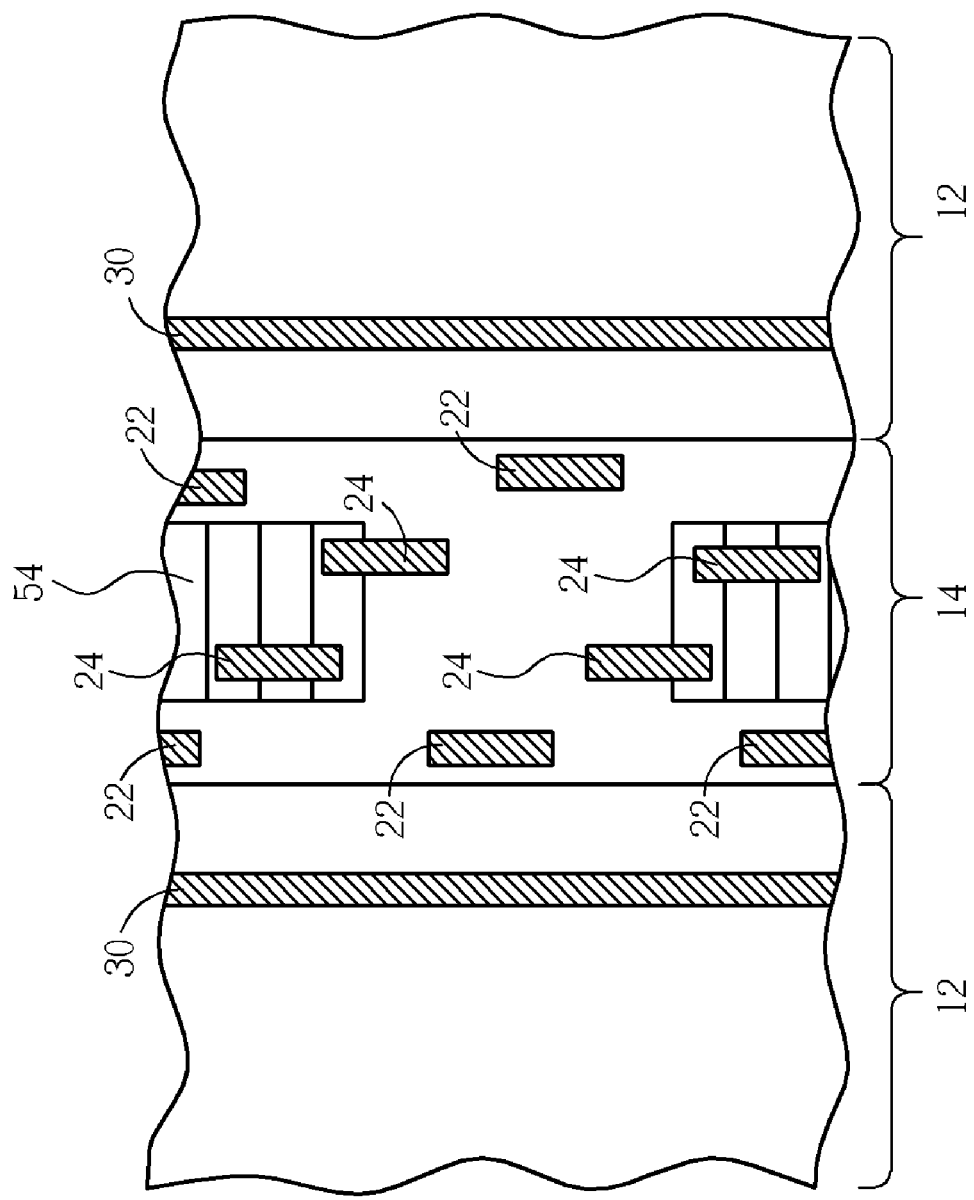
FIG. 3 is an enlarged, schematic plan view of the dicing line between two circuit chips of a semiconductor wafer in accordance with another preferred embodiment of this invention.

Please refer to FIG. 3. FIG. 3 is an enlarged, schematic plan view of the dicing line between two circuit chips of a semiconductor wafer in accordance with another preferred embodiment of this invention. As shown in FIG. 3, in accordance with another preferred embodiment, the reinforcing structure 20 comprises holes 24 that are directly above or partially overlap with the test key circuits 54. The holes 24 function as a stress releaser capable of releasing stress produced during wafer dicing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor wafer comprising:
    a plurality of active circuit die areas, each of which being bordered by a dicing line region through which the plurality of active circuit die areas are separated from each other by mechanical wafer dicing, wherein each of the plurality of active circuit die areas has four sides;
    an overcoat covering both the active circuit die areas and the dicing line region;
    an inter-layer dielectric layer disposed underneath the overcoat;
    a reinforcement structure comprising a plurality of holes formed within the dicing line region, wherein the plurality of holes are formed by etching through the overcoat into the inter-layer dielectric layer and are disposed along the four sides of each active circuit die area; and
    a die seal ring in between the active circuit chip area and the reinforcement structure.

2. The semiconductor wafer according to claim 1 wherein the overcoat includes silicon nitride.

3. A semiconductor wafer comprising:
    a plurality of active circuit die areas, each of which being bordered by a dicing line region through which the plurality of active circuit die areas are separated from each other, wherein each of the plurality of active circuit die areas has four sides;
    a plurality of test key circuits disposed on the dicing line region;
    an overcoat covering both the active circuit die areas and the dicing line region;
    a reinforcement structure comprising a plurality of first row of holes formed by etching through the overcoat and disposed around the four sides of each active circuit die area, and a second row of holes etched through the overcoat, wherein the second row of holes are disposed directly above or partially overlapping with the test key circuits; and
    a die seal ring in between the active circuit chip area and the reinforcement structure.

4. The semiconductor wafer according to claim 3 wherein the overcoat includes silicon nitride.

* * * * *